United States Patent [19]
Chung et al.

[11] Patent Number: 5,604,156
[45] Date of Patent: Feb. 18, 1997

[54] WIRE FORMING METHOD FOR SEMICONDUCTOR DEVICE

[75] Inventors: U-in Chung, Suwon; Jae-duk Kim, Kyungki-do; Chang-ki Hong, Suwon, all of Rep. of Korea

[73] Assignee: Samsung Electronics Co., Ltd., Suwon, Rep. of Korea

[21] Appl. No.: 560,913

[22] Filed: Nov. 20, 1995

[30] Foreign Application Priority Data

Nov. 30, 1994 [KR] Rep. of Korea ............ 94-32134

[51] Int. Cl.$^6$ ............................................. H01L 21/44
[52] U.S. Cl. ........................................ 437/195; 156/644.1
[58] Field of Search ......................... 437/195, 228 CON, 437/228 POL, 235, 238, 203; 156/644.1

[56] References Cited

U.S. PATENT DOCUMENTS

| | | | |
|---|---|---|---|
| 4,832,789 | 5/1989 | Cochran et al. | 156/644 |
| 5,063,176 | 11/1991 | Lee et al. | 437/195 |
| 5,354,712 | 10/1994 | Ho et al. | 437/195 |
| 5,451,551 | 9/1995 | Krishnan et al. | 437/241 |

OTHER PUBLICATIONS

Anonymous, "Edge sloping via holes . . . " (Jul. 1988) Research Disclosure 291,013.

Primary Examiner—John Niebling
Assistant Examiner—C. Everhart

[57] ABSTRACT

A wire forming method for a semiconductor device includes the steps of depositing an insulation material on a semiconductor substrate and patterning the insulation material to form a first insulation layer, forming a lower capping layer on the first insulation layer, etching the lower capping layer and the first insulation layer to form a first contact hole that exposes a first part of the semiconductor substrate, forming a wire layer over the capping layer and the first part of the semiconductor substrate, performing a chemical and mechanical polishing (CMP) process with respect to the wire layer and the lower capping layer to expose the first insulation layer, forming a second insulation layer over the wire layer and the first insulation layer, and etching the first and second insulation layers to form a second contact hole that exposes a second part of the semiconductor substrate. The wire forming method can prevent the lifting of the wire layer, the splitting of the lower insulation layer, and the formation of a protrusion n the second contact hole.

22 Claims, 6 Drawing Sheets

WIRE FORMING METHOD FOR SEMICONDUCTOR DEVICE

BACKGROUND OF THE INVENTION

The present invention relates to wire forming method for a highly integrated semiconductor device. More particularly, this invention relates to a reliable wire-forming method which prevents a protrusion from being formed within a contact hole when a capping layer is used in a semiconductor device.

Aluminum (Al) base wire material is widely adopted in forming wires in semiconductor devices. However, since the melting point of aluminum is low, its use precludes any processes subsequent to the formation of an Al wire layer from taking place at a temperature higher than 500° C. In order to enable subsequent high temperature heating processes, it has been proposed to use a refractory metal having a high melting point to form a metal wire layer. However, when a refractory metal is used as the wire material and additional high-temperature (500° C. to 1000° C.) processes are implemented, a number of potential fabrication problems arise. For example, the refractory metal may lift off of the insulation layer it is formed on or the insulation layer may split. These problems arise due to the difference in thermal expansion coefficients between the refractory metal and the material used to form the insulation layer.

In order to eliminate these problems, the upper or lower portion of the refractory metal wire layer is capped with an nonductile insulation material such as an oxide or a nitride using a plasma enhanced chemical vapor deposition (PECVD) or a low pressure chemical vapor deposition (LPCVD) method. This nonductile insulation material suppresses the development of the stresses caused by the difference in the coefficients of thermal expansion of the refractory metal and the insulation layers.

Figure 1A:
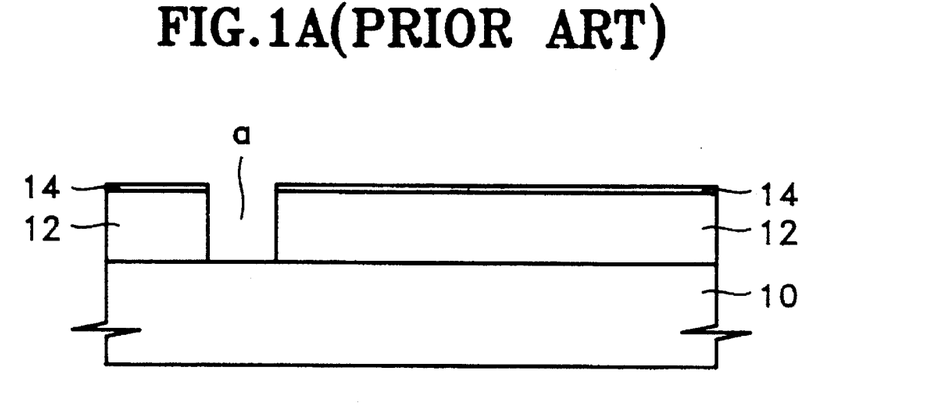
FIGS. 1A through 1E are views illustrating an example of a conventional wire forming method.

FIGS. 1A to 1E show an example of a conventional wire forming method. Referring to FIG. 1A, a first insulation layer 12 is formed on a semiconductor substrate 10 using a ductile insulation, material such as a borophosphorus silica glass (BPSG), phosphorus silica glass (PSG), or boro silica glass (BSG). A first capping layer 14 is then formed on the first insulation layer 12 using a nonductile insulation material such as silicon nitride (Si N). Finally, a first contact hole a is formed in the first insulation layer 12 by a conventional photolithography process, exposing a first part of the semiconductor substrate 10.

Figure 1B:
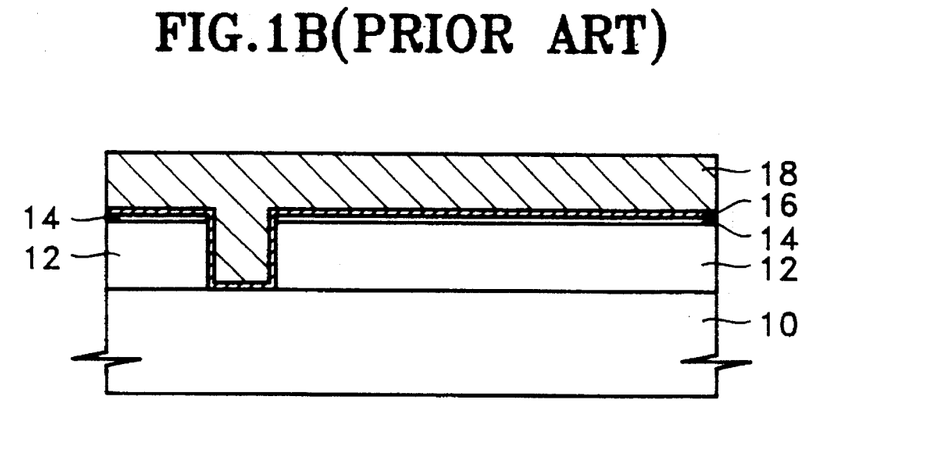
Figure 1C:
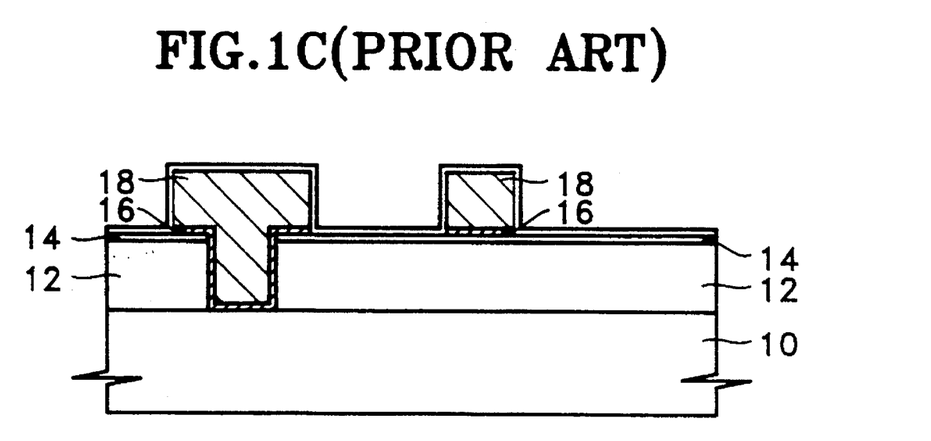

Referring to FIG. 1B, titanium (Ti) or titanium nitride (TIN) is deposited on the surface of the first insulation layer 12 and the semiconductor substrate 10, including the walls of the first contact hole a, to form a barrier layer 16. Then, a refractory metal such as tungsten (W) is deposited to a predetermined thickness on the barrier layer 16, filling the contact hole a, and forming a wire layer 18.

Referring to FIG. 1 C, wire layer 18 and barrier layer 16 are then patterned by a conventional photolithography process. Next, a second capping layer 20 is formed on the whole of the resulting structure using nonductile insulation material such as silicon nitride (SiN).

Figure 1D:
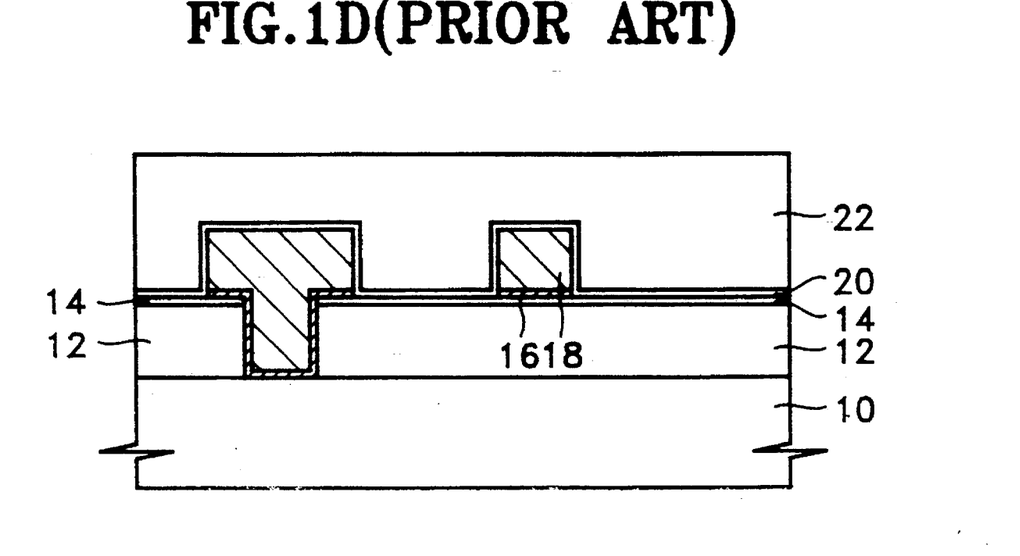

Referring to FIG. 1D, additional ductile insulation material, such as BPSG, PSG or BSG, is deposited on the surface of the second capping layer 20 to form a second insulation layer 22.

Figure 1E:
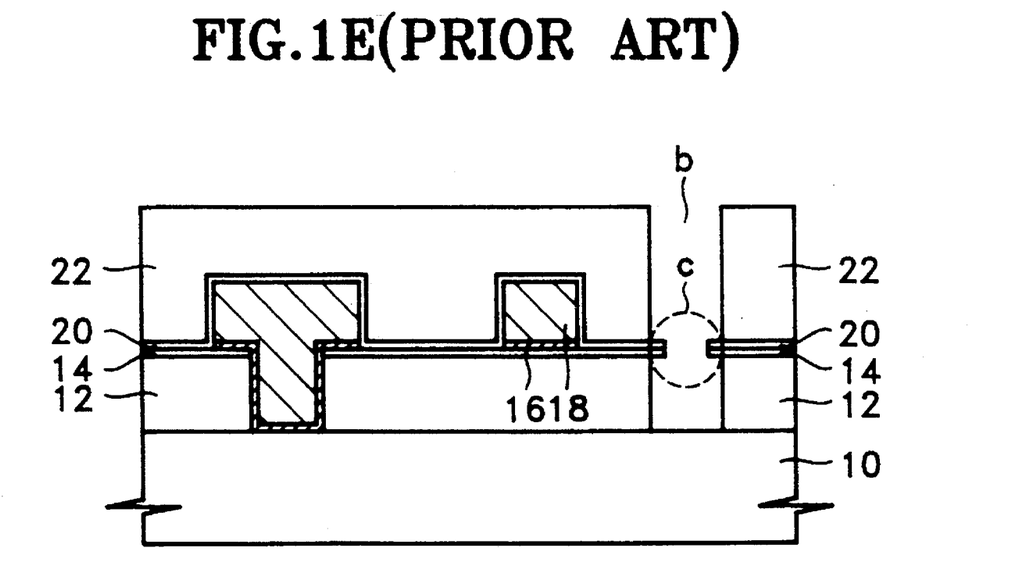

Referring to FIG. 1E, the second insulation layer 22, the first and second capping layers 14 and 20, and the first insulation layer 12 are then etched by a conventional photolithography process, to form a second contact hole b which exposes a second part of the semiconductor substrate 10.

According to this method, the first and second capping layers 14 and 20 are formed of a hard, nonductile material that encloses the wire layer 18, preventing the wire layer from lifting off of the first insulating layer 12 and preventing the first insulating layer 12 from splitting.

However, when the second contact hole b is formed using a conventional photolithography, a protrusion (portion c in FIG. 1E) is produced in the second contact hole b. This protrusion results from the difference in the etch rates of first and second insulation layers 12 and 22, which are formed of a ductile insulation material, and etch rates of the first and second capping layers 14 and 20, which are formed of a nonductile insulation material. The existence of this protrusion c serves to lower the reliability of the wire-forming process of the semiconductor device.

SUMMARY OF THE INVENTION

Therefore, it is an object of the present invention to provide a method for forming reliable wire forming method of a semiconductor device by preventing a protrusion from being formed in a contact hole.

To accomplish the above object, there is provided a wire forming method for a semiconductor device including the steps off depositing insulation material over a semiconductor substrate and patterning the insulation material to form a first insulation layer; forming a lower capping layer over the first insulation layer; etching the lower capping layer and the first insulation layer to form a first contact hole that exposes a first part of the semiconductor substrate; forming a wire layer over the capping layer and the first part of the semiconductor substrate; performing a chemical and mechanical polishing (CMP) process with respect to the wire layer and the lower capping layer to expose the first insulation layer; forming a second insulation layer over the wire layer and the first insulation layer; and etching the first and second insulation layers to form a second contact hole that exposes a second part of the substrate.

The first wire layer is preferably formed of a refractory metal, and the refractory metal is preferably selected from the group consisting of tungsten (W), molybdenum (Mo), titanium nitride (TiN), and copper (Cu). After forming the first contact hole, there may be the further step of forming a barrier layer. Also, the first and second insulation layers are preferably formed of a ductile insulation material, which is preferably selected from the group consisting of BPSG, BSG, PSG, $GeSiO_2$, GeBPSG, and AsBPSG. The lower capping layer is preferably formed of a nonductile insulation material, which is preferably selected from the group consisting of SiN, $SiO_2$, $Si_3N_4$, BN, SiBN, and $Al_2O_3$.

To accomplish the above object, there is also provided a wire forming method for a semiconductor device including the steps of: depositing an insulation material over a semiconductor substrate and patterning the insulation material to form a first insulation layer; forming a lower capping layer over the first insulation layer; etching the lower capping layer and the first insulation layer to form a first contact hole that exposes a first part of the semiconductor substrate; forming a wire layer over the lower capping layer and the first part of the semiconductor substrate; performing a primary chemical and mechanical polishing (CMP) step with respect to the wire layer to expose the lower capping layer; performing a secondary chemical and mechanical polishing (CMP) step with respect to the lower capping layer and the wire layer to expose the first insulation capping layer; forming a second insulation layer over the wire layer and the first insulation layer; and etching the first and second insulation layers to form a second contact hole that exposes a second part of the semiconductor substrate.

Moreover, to accomplish the above object, there is provided a wire forming method for a semiconductor device including the steps of: depositing an insulation material over a semiconductor substrate and patterning the insulation material to form a first insulation layer; forming a lower capping layer over the first insulation layer; etching the lower capping layer and the first insulation layer to form a first contact hole that exposes a first part of the semiconductor substrate; forming a wire layer over the lower capping layer and the first part of the semiconductor substrate; performing a primary chemical and mechanical polishing (CMP) step with respect to the wire layer and the lower capping layer to expose the first insulation layer; selectively etching the wire layer to form a step difference between the wire layer and the first insulation layer; forming an upper capping layer over the wire layer and the first insulating layer; performing a secondary chemical and mechanical polishing (CMP) step with respect to the upper capping layer, the first insulation layer, and the lower capping layer to remove the step difference; forming a second insulation layer over the upper capping layer and the first insulation layer; and etching the first and second insulation layers to form a second contact hole that exposes a second part of the semiconductor substrate.

Preferably, the upper capping layer is formed of a nonductile insulation material.

According to the present invention, only the surface of the wire layer is coated with the nonductile insulation material such as an oxide or a nitride using the CMP step. This prevents the lifting of the wire layer, the splitting of the insulation layer, and the formation of a protrusion within the second contact hole. As a result, this forms a more reliable metal wire.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS OF THE INVENTION

Figure 2A:
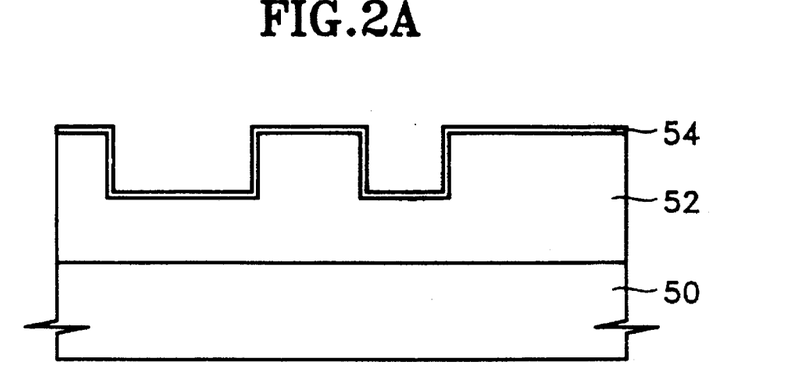
FIGS. 2A through 2F are diagrams illustrating a wire forming method according to a first preferred embodiment of the present invention.

FIGS. 2A through 2F are diagrams illustrating a wire forming method according to a first preferred embodiment of the present invention;

FIG. 2A shows a step of forming a lower capping layer 54. A first insulation layer 52 is initially formed on a semiconductor substrate 50 using a ductile insulation material such as BPSG. Then, the first insulation layer 52 is patterned by photolithography to include a plurality of depressions. Subsequently, a nonductile insulation material such as SiN is deposited on the first insulation layer 52 to form the lower capping layer 54.

Although in the first preferred embodiment BPSG is used as the first insulation layer 52, any similar nonductile material, such as BSG, PSG, GeSiO$_2$, GeBPSG, or AsBPSG, may be used instead.

The thickness of lower capping layer 54 may vary according to the wire width in the range of 10–3,000 Å, and SiO$_2$, Si$_3$N$_4$, BN, SiBN, Al$_2$O$_3$, or any similar material may be adopted instead of SiN. Lower capping layer 54 is preferably formed using PECVD, LPCVD, or sputtering processes.

Figure 2B:
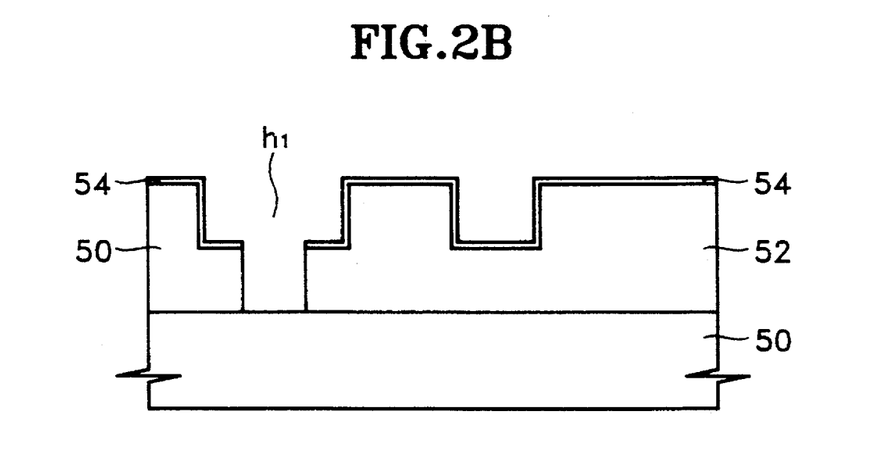

FIG. 2B shows a step of forming a first contact hole $h_1$. A photoresist (not shown) is first deposited on the lower capping layer 54. Next, a photoresist pattern (not shown) is created for forming a contact hole. The lower capping layer 54 and the first insulation layer 52 are then etched using the photoresist pattern as an etching mask to form first contact hole $h_1$ thus exposing a first part of the semiconductor substrate 50.

Figure 2C:
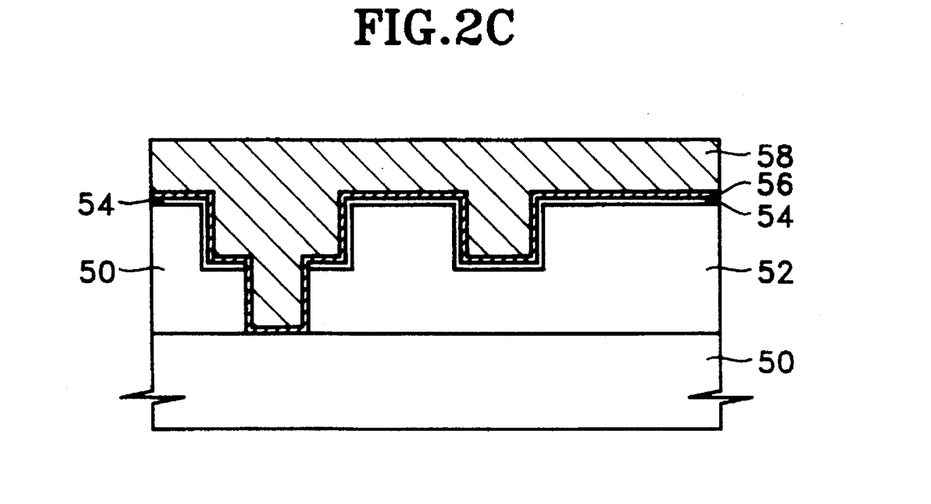

FIG. 2C shows a step of forming a barrier layer 56 and a wire layer 58. A barrier layer 56, preferably comprising titanium (Ti), is first formed over the entire semiconductor structure, including the lower capping layer 54, the semiconductor substrate 50, and the walls of the first contact hole $h_1$. A refractory metal, preferably tungsten (W), is then deposited on the barrier layer 56 to form a wire layer 58.

The barrier layer 56 improves the contact resistance between the silicon substrate and the wire layer and prevents silicon from diffusing into the substrate. Although titanium is used as the barrier layer 56 in the first preferred embodiment, titanium nitride (TiN), titanium tungsten (TiW), molybdenum (Mo) or any compound of these materials may be used.

The wire layer 58 is preferably formed of a refractory metal having a melting point higher than 600° C. so that higher temperature processes may be performed subsequent to the wire-forming steps. Although tungsten is used to form the wire layer in the first preferred embodiment, molybdenum (Mo), titanium nitride (TIN), copper (Cu), or any suitable refractory metal may be used. The wire layer 58 is preferably deposited using a CVD method such as PECVD or by a PVD method such as sputtering. In particular, it is preferable to use a CVD method having a very good step coverage.

Figure 2D:
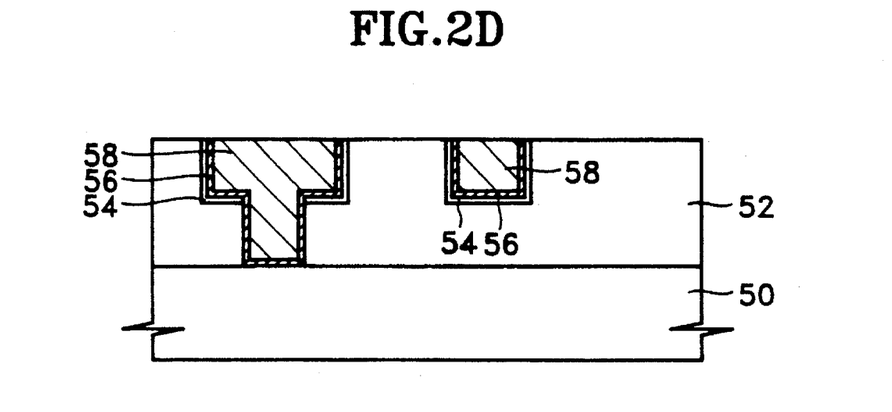

FIG. 2D shows a chemical and mechanical polishing (CMP) step. In this step, the wire layer 58, the barrier layer, 56 and the lower capping layer 54 are polished by a conventional CMP step to expose the first insulation layer 52. This has the effect of planarizing the surface of substrate 50.

Figure 2E:
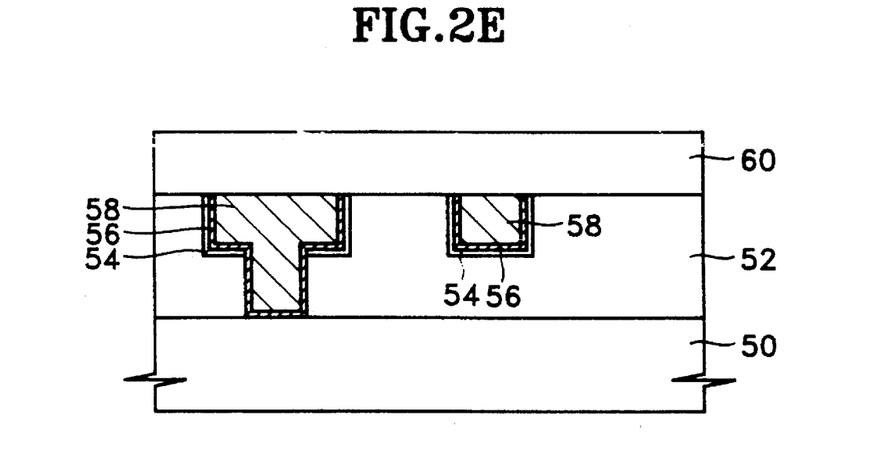

FIG. 2E shows a step of forming a second insulation layer 60. In this step a ductile insulation material, e.g., BPSG, is deposited on the polished surface of the structure shown in FIG. 2D to form the second insulation layer 60.

Figure 2F:
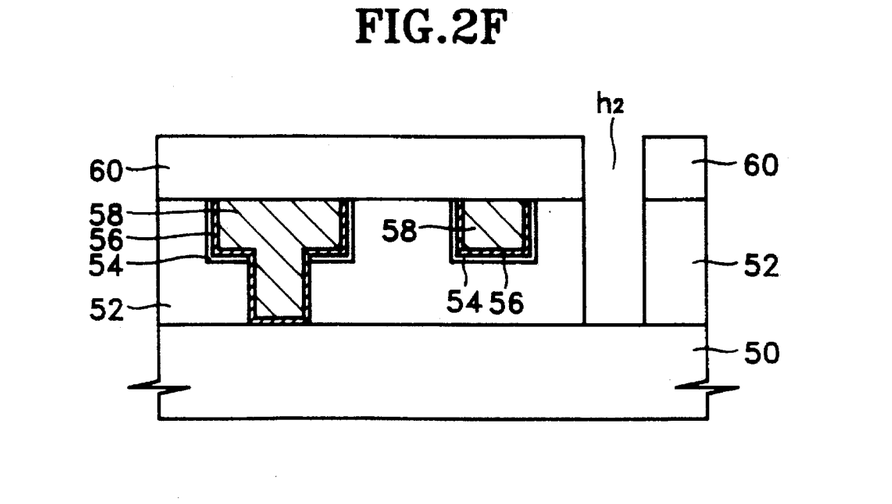

As shown in FIG. 2F, a second contact hole $h_2$ is then formed by etching the first and second insulation layers 52 and 60 by a conventional photolithography process. This forms the second contact hole $h_2$ and partially exposes a second part of the semiconductor substrate 50.

According to the first embodiment of the present invention, the formation of a protrusion in the contact hole $h_2$ is prevented by removing the lower capping layer 54 from the area where the contact hole $h_2$ will be formed. This portion of the lower capping layer 54 is removed by using a CMP process prior to the step of forming the contact hole $h_2$.

Figure 3A:
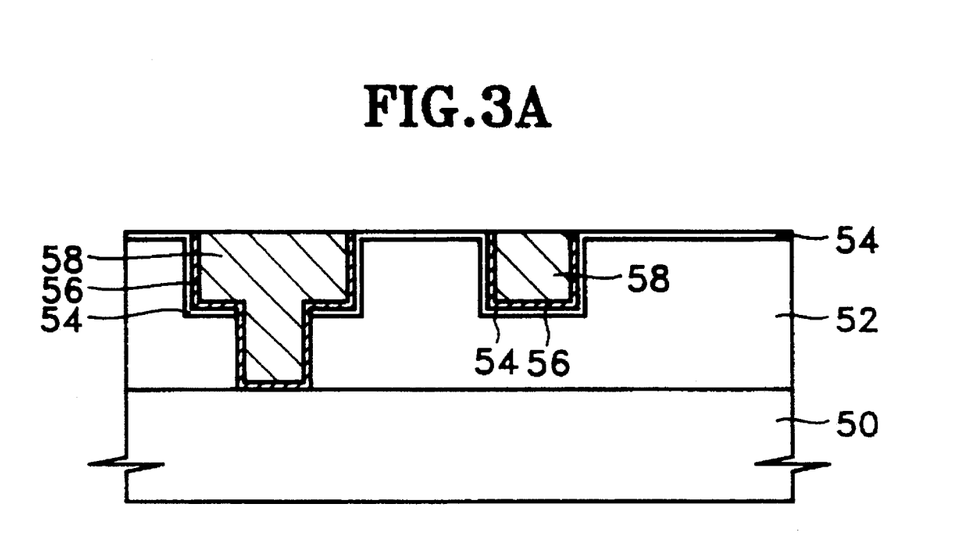
FIGS. 3A and 3B are diagrams illustrating a wire forming method according to a second preferred embodiment of the present invention.
Figure 3B:
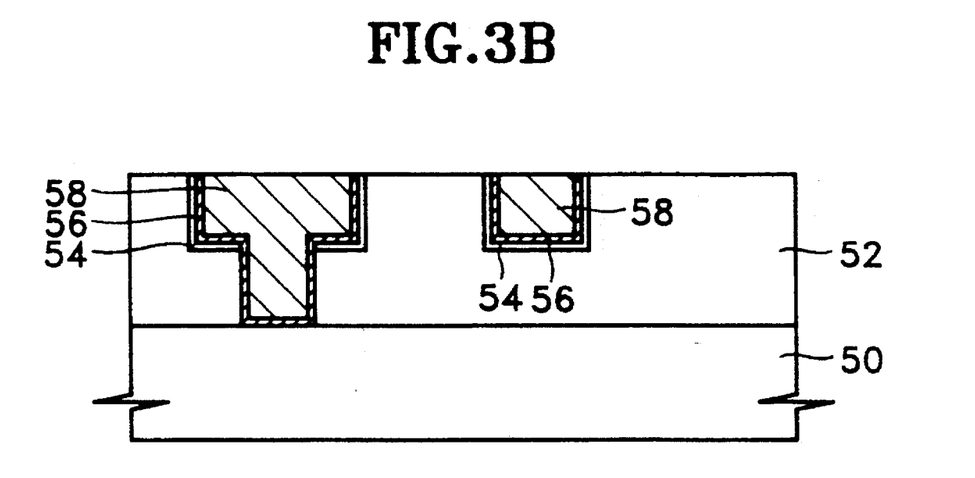

FIGS. 3A and 3B are diagrams illustrating a wire forming method according to a second preferred embodiment of the present invention. The second preferred embodiment is substantially identical to the first preferred embodiment, except for the step of forming the wire layer 58 (shown in FIG. 2D for the first preferred embodiment). The second preferred embodiment forms the wire layer 58 by performing primary and secondary CMP steps, rather than the single CMP step performed in the first preferred embodiment.

FIG. 3A shows the primary CMP step. Using the conventional CMP method, the wire layer 58 and the barrier layer 56 are both polished under the same CMP conditions as those in the first preferred embodiment until the lower capping layer 54 is exposed. In the primary CMP step, the nonductile lower capping layer 54 is used as a polishing stopper and serves to limit the extent of the primary CMP step.

FIG. 3B shows the secondary CMP step. After the primary CMP, the lower capping layer 54, the wire layer 58 and the barrier layer 56 are polished until the first insulation layer 52 is exposed. This secondary CMP step is performed under CMP conditions that allow the nonductile insulation layer to be polished.

By using a primary polishing step that uses the lower capping layer as a polishing stop and then following up with a secondary polishing step, the second preferred embodiment can control the fabrication process with more precision.

The steps following the primary and secondary CMP steps are preferably performed under the same conditions as those in the first preferred embodiment (as shown in FIGS. 2E and 2F).

Figure 4A:
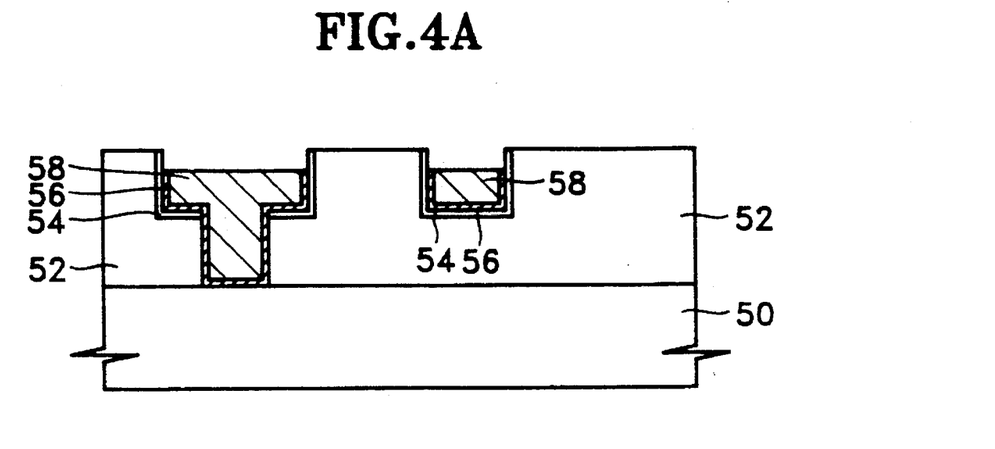
FIGS. 4A through 4C are diagrams illustrating a wire forming method according to third and fourth preferred embodiments of the present invention.
Figure 4B:
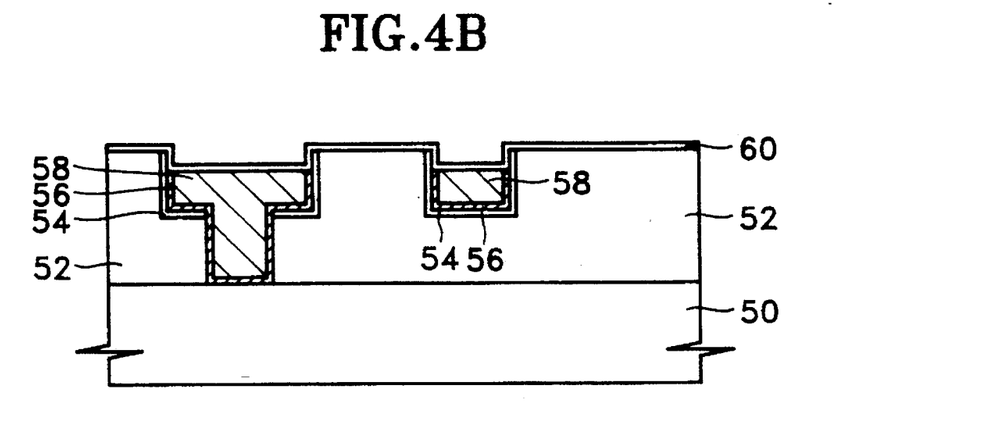
Figure 4C:
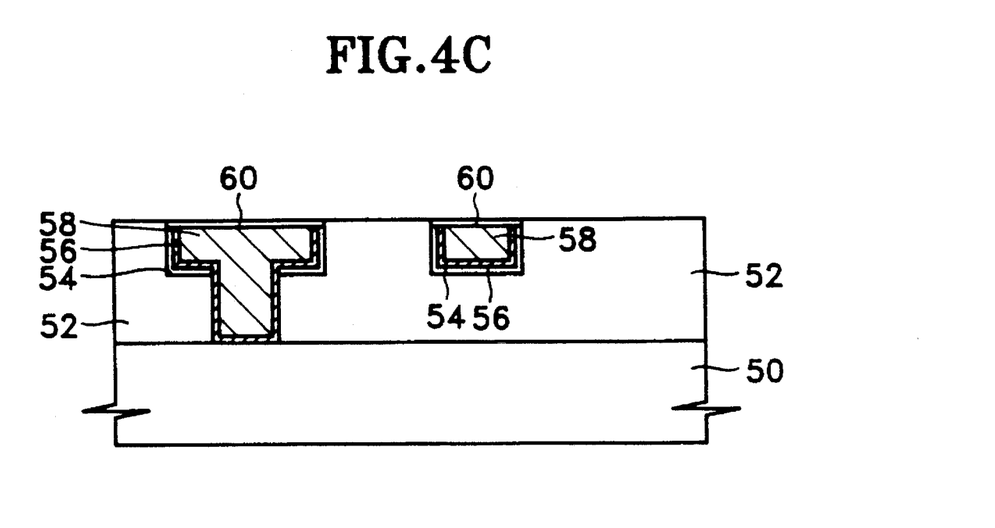

FIGS. 4A through 4C are diagrams illustrating a wire forming method according to third and fourth preferred embodiments of the present invention. The third and fourth preferred embodiments are substantially identical to the first preferred embodiment, except for the step of forming the wire layer 58 (shown in FIG. 2D for the first preferred embodiment). In the third and fourth preferred embodiments, after the CMP step the wire layer 58 and the barrier layer 56 are partially etched using a wet etching or dry etching method to generate step difference between the wire layer 58 and the first insulation layer 52.

FIG. 4A shows a step of etching the wire layer 58 and the barrier layer 56. In order to remove only the wire layer 58 and the barrier layer 56, this step preferably employs a reactive ion etching (RIE) method using an etching gas such as $Cl_2$ or $SF_6$, or a magnetic enhanced reactive ion etching (MERIE) method. As a result, this step obtains an etching selection ratio of the wire layer 58 and the barrier layer 56 exceeding a ratio of 10 to 1.

FIG. 4B shows a step of forming an upper capping layer 60. A nonductile insulation material such as silicon nitride (SiN) is deposited on the whole surface of the structure shown in FIG. 4A to form the upper capping layer 60.

FIG. 4C shows a CMP process for polishing the upper capping layer 60 and part of the first insulating layer 52. Using a conventional CMP method, the upper capping layer 60 and the first insulation layer 52 are polished until the step difference between upper capping layer 60 formed on the wire layer 58 and first insulation layer 52 is removed. At this time, the CMP process continues until only the portion of the upper capping layer 60 formed on wire layer 58 remains.

The subsequent steps following this CMP process proceed under the same conditions as those in the first embodiment (as shown in FIGS. 2E and 2F).

In a fourth preferred embodiment, the steps shown in FIGS. 4A to 4C are performed after the primary and secondary CMP steps from the second preferred embodiment. Otherwise the fourth preferred embodiment is substantially identical to the third preferred embodiment.

The use of both upper and lower capping layers 54 and 60 in the third and fourth preferred embodiments of the present invention and the resulting device structure make it easier to suppress the stress applied to the refractory metal wire layer 58.

According to the present invention, only the surface of a wire layer is coated with a nonductile material such as an oxide or a nitride by adopting a CMP process. This prevents the lifting of a wire layer, the splitting of a lower insulation layer, and the formation of a protrusion during the subsequent heating treatment process. In this way the methods of this invention can form a reliable metal wire.

The present invention is not limited to the above-described embodiments and various changes and modifications may be effected by one having an ordinary skill in the art within the scope of the invention as, defined by the appended claims.

What is claimed is:

1. A wire forming method for a semiconductor device including the steps of:

forming a first insulation layer on a semiconductor substrate;

forming recessed portions on the surface of the first insulation layer by etching the first insulation layer to a preferred thickness;

forming a lower capping layer over the first insulation layer after the step of forming recessed portions;

etching the lower capping layer and one of the recessed portions of the first insulation layer to form a first contact hole exposing a first portion of the semiconductor substrate;

forming a barrier layer over the lower capping layer and the first part of the semiconductor substrate;

forming a wire layer over the barrier layer;

performing a chemical and mechanical polishing (CMP) process on the wire layer, the barrier layer, and the lower capping layer to expose the first insulation layer;

forming a second insulation layer over the wire layer and the first insulation layer; and etching the first and second insulation layers to form a second contact hole that exposes a second part of the substrate.

2. A wire forming method for a semiconductor device as claimed in claim 1, wherein the wire layer is formed of a refractory metal or copper.

3. A wire forming method for a semiconductor device as claimed in claim 2, wherein the refractory metal is selected from the group consisting of tungsten (W), molybdenum (Mo), and titanium nitride (TIN).

4. A wire forming method for a semiconductor device as claimed in claim 1, wherein the first and second insulation layers are formed of a ductile insulation material.

5. A wire forming method for a semiconductor device as claimed in claim 4, wherein the ductile insulation material is selected from the group consisting of BPSG, BSG, PSG, $GeSiO_2$, GeBPSG and AsBPSG.

6. A wire forming method for a semiconductor device as claimed in claim 1, wherein the lower capping layer is formed of a nonductile insulation material.

7. A wire forming method for a semiconductor device as claimed in claim 5, wherein the non-ductile insulation material is selected from the group consisting of SiN, $SiO_2$, $Si_3N_4$, BN, SiBN and $Al_2O_3$.

8. A wire forming method for a semiconductor device including the steps of:

forming a first insulation layer on a semiconductor substrate;

forming recessed portions on the surface of the first insulation layer by etching the first insulation layer to a preferred thickness;

forming a lower capping layer over the first insulation layer after the step of forming recessed portions;

etching the lower capping layer and one of the recessed portions of the first insulation layer to form a first contact hole that exposes a first part of the semiconductor substrate;

forming a barrier layer over the lower capping layer and the first part of the semiconductor substrate;

forming a wire layer over the barrier layer;

performing a primary chemical and mechanical polishing (CMP) step with respect to the wire layer and the barrier layer to expose the lower capping layer;

performing a secondary chemical and mechanical polishing (CMP) step with respect to the lower capping layer and the wire layer to expose the first insulation layer;

forming a second insulation layer over the wire layer and the first insulation layer; and etching the first and second insulation layers to form a second contact hole that exposes a second part of the semiconductor substrate.

9. A wire forming method for a semiconductor device as claimed in claim 8, wherein the wire layer is formed of a refractory metal or copper.

10. A wire forming method for a semiconductor device as claimed in claim 9, wherein the refractory metal is selected from the group consisting of tungsten (W), molybdenum (Mo), and titanium nitride (TIN).

11. A wire forming method for a semiconductor device as claimed in claim 8, wherein the first and second insulation layers are formed of a ductile insulation material.

12. A wire forming method for a semiconductor device as claimed in claim 11, wherein the ductile insulation material is selected from the group consisting of BPSG, BSG, PSG, $GeSiO_2$, GeBPSG and AsBPSG.

13. A wire forming method for a semiconductor device as claimed in claim 8, wherein the lower capping layer is formed of a nonductile insulation material.

14. A wire forming method for a semiconductor device as claimed in claim 13, wherein the nonductile insulation material is selected from the group consisting of SiN, $SiO_2$, $Si_3N_4$, BN, SiBN and $Al_2O_3$.

15. A wire forming method for a semiconductor device including the steps of:

forming a first insulation layer on a semiconductor substrate;

forming recessed portions on the surface of the first insulation layer by etching the first insulation layer to a preferred thickness;

forming a lower capping layer over the first insulation layer after the step of forming recessed portions;

etching the lower capping layer and one of the recessed portions of the first insulation layer to form a first contact hole that exposes a first part of the semiconductor substrate;

forming a barrier layer over the lower capping layer and the first part of the semiconductor substrate;

forming a wire layer over the barrier layer;

performing a primary chemical and mechanical polishing (CMP) step with respect to the wire layer, the barrier layer, and the lower capping layer to expose the first insulation layer;

selectively etching the wire layer and the barrier layer to form a step difference between the wire layer and the first insulation layer;

forming an upper capping layer over the wire layer and the first insulating layer;

performing a secondary chemical and mechanical polishing (CMP) step with respect to the upper capping layer, the first insulation layer, and the lower capping layer to remove the step difference;

forming a second insulation layer over the upper capping layer and the first insulation layer; and etching the first and second insulation layers to form a second contact hole that exposes a second part of the semiconductor substrate.

16. A wire forming method for a semiconductor device as claimed in claim 15, wherein the upper capping layer is formed of a nonductile insulation material.

17. A wire forming method for a semiconductor device as claimed in claim 15, wherein the wire layer is formed of a refractory metal or copper.

18. A wire forming method for a semiconductor device as claimed in claim 17, wherein the refractory metal is selected from the group consisting of tungsten (W), molybdenum (Mo), and titanium nitride (TIN).

19. A wire forming method for a semiconductor device as claimed in claim 15, wherein the first and second insulation layers are formed of a ductile insulation material.

20. A wire forming method for a semiconductor device as claimed in claim 19, wherein the ductile insulation material is selected from the group consisting of BPSG, BSG, PSG, $GeSiO_2$, GeBPSG and AsBPSG.

21. A wire forming method for a semiconductor device as claimed in claim 15, wherein the lower capping layer is formed of a nonductile insulation material.

22. A wire forming method for a semiconductor device as claimed in claim 21, wherein the non-ductile insulation material is selected from the group consisting of SiN, $SiO_2$, $Si_3N_4$, BN, SiBN and $Al_2O_3$.

\* \* \* \* \*